United States Patent [19]

Kutka

[11] Patent Number: 5,262,776
[45] Date of Patent: Nov. 16, 1993

[54] PROCESS FOR USE WITH LEMPEL/GIN ENCODING

[75] Inventor: Robert Kutka, Geltendorf, Fed. Rep. of Germany

[73] Assignee: Siemens Aktiengesellschaft, Munich, Fed. Rep. of Germany

[21] Appl. No.: 781,186
[22] PCT Filed: Mar. 21, 1990
[86] PCT No.: PCT/DE90/00223
 § 371 Date: Dec. 11, 1991
 § 102(e) Date: Dec. 11, 1991
[87] PCT Pub. No.: WO91/00652
 PCT Pub. Date: Jan. 10, 1991

[30] Foreign Application Priority Data

Jun. 30, 1989 [DE] Fed. Rep. of Germany ....... 3921646

[51] Int. Cl.⁵ .............................................. H03M 7/00
[52] U.S. Cl. ................................. 341/51; 364/251.6
[58] Field of Search ................... 341/51, 67, 87, 95, 341/106; 364/251.6, 260.6

[56] References Cited

U.S. PATENT DOCUMENTS 4,464,650  8/1984  Eastman et al. ..................... 341/51
4,558,302  12/1985  Welch ................................ 341/51

OTHER PUBLICATIONS

"How to Quadruple Dial-Up Communications Efficiency", Mini-Micro Systems, No. 2, Feb. 1988, by F. Beason pp. 77-81.
"A Universal Algorithm for Sequential Data Compression", IEEE Transactions on Information Theory, vol. ITT-23, No. 3, May 1977, by J. Ziv and A. Lempel, pp. 337-343.

Primary Examiner—A. D. Pellinen
Assistant Examiner—Brian K. Young
Attorney, Agent, or Firm—Hill, Steadman & Simpson

[57] ABSTRACT

An A. Lempel and J. Ziv code is frequently used for coding a sequence of elements of, for example, coefficients of a discrete cosine transform for image values of picture elements of a reproduced image. An extremely fast code generation process is disclosed for this. In coding steps, code words are marked at coding sites in accordance with the partial sequences found. The coding steps are linked by coding step pointers. The sequence of elements from a primary sequence can be converted into elements from a reduced set of elements using escape sequences.

11 Claims, 7 Drawing Sheets

FIG. 1

|  | 100.0 | 100.1 | 100.2 |  |  | 100.63 |
|---|---|---|---|---|---|---|
| 200.0 | 300.0 | 300.1 | 300.2 |  |  | 300.63 |
|  | 0 | 0 | 0 |  |  | 0 |

FIG. 2

|  | 100.0 | 100.1 | 100.2 |  |  | 100.63 |
|---|---|---|---|---|---|---|
| 200.0 | 300.0 | 300.1 | 300.2 |  |  | 300.63 |
|  | 400.1 | 0 | 0 |  |  | 0 |
| 200.1 | 300.64 | 0 | 0 |  |  | 0 |
|  | 0 | 0 | 0 |  |  | 0 |

FIG. 3

|  | 100.0 | 100.1 | 100.2 |  |  | 100.63 |
|---|---|---|---|---|---|---|
| 200.0 | 300.0 | 300.1 | 300.2 |  |  | 300.63 |
|  | 400.1 | 0 | 0 |  |  | 0 |
| 200.1 | 300.64 | 0 | 0 |  |  | 0 |
|  | 400.2 | 0 | 0 |  |  | 0 |
| 200.2 | 0 | 0 | 0 |  |  | 300.65 |
|  | 0 | 0 | 0 |  |  | 0 |

FIG. 4

| | 100.0 | 100.1 | 100.2 | | 100.63 |
|---|---|---|---|---|---|
| 200.0 | 300.0 | 300.1 | 300.2 | | 300.63 |
| | 400.1 | 0 | 0 | | 400.3 |
| 200.1 | 300.64 | 0 | 0 | | 0 |
| | 400.2 | 0 | 0 | | 0 |
| 200.2 | 0 | 0 | 0 | | 300.65 |
| | 0 | 0 | 0 | | 0 |
| 200.3 | 0 | 0 | 0 | | 300.66 |
| | 0 | 0 | 0 | | 0 |

FIG. 5

| | 100.0 | 100.1 | 100.2 | | 100.63 |
|---|---|---|---|---|---|
| 200.0 | 300.0 | 300.1 | 300.2 | | 300.63 |
| | 400.1 | 0 | 0 | | 400.3 |
| 200.1 | 300.64 | 0 | 0 | | 0 |
| | 400.2 | 0 | 0 | | 0 |
| 200.2 | 0 | 0 | 0 | | 300.65 |
| | 0 | 0 | 0 | | 0 |
| 200.3 | 300.67 | 0 | 0 | | 300.66 |
| | 0 | 0 | 0 | | 0 |

|  | 100.0 | 100.1 | 100.2 | | 100.63 |
|---|---|---|---|---|---|
| 200.0 | 300.0 | 300.1 | 300.2 | | 300.63 |
|  | 400.1 | 0 | 0 | | 400.3 |
| 200.1 | 300.64 | 0 | 0 | | 0 |
|  | 400.2 | 0 | 0 | | 0 |
| 200.2 | 300.68 | 0 | 0 | | 300.65 |
|  | 0 | 0 | 0 | | 0 |
| 200.3 | 300.67 | 0 | 0 | | 300.66 |
|  | 0 | 0 | 0 | | 0 |

FIG. 7.0

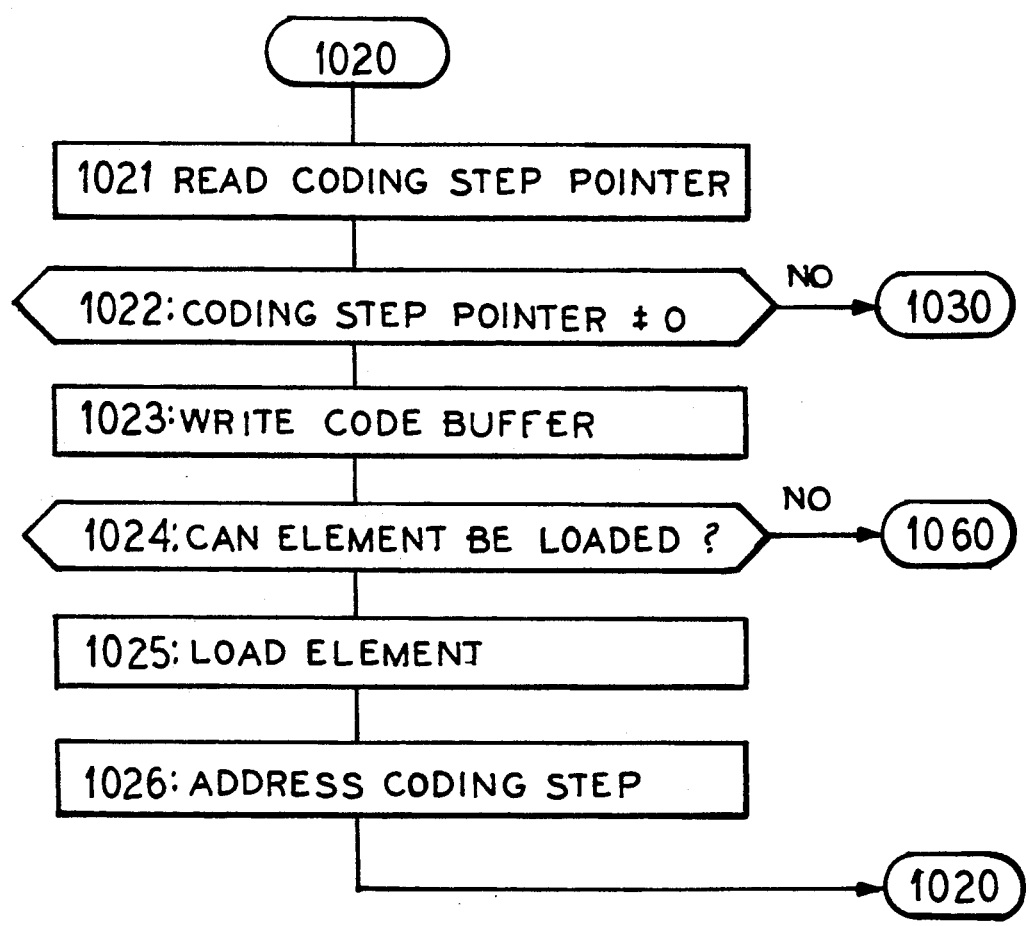
FIG. 7.1

FIG. 7.2
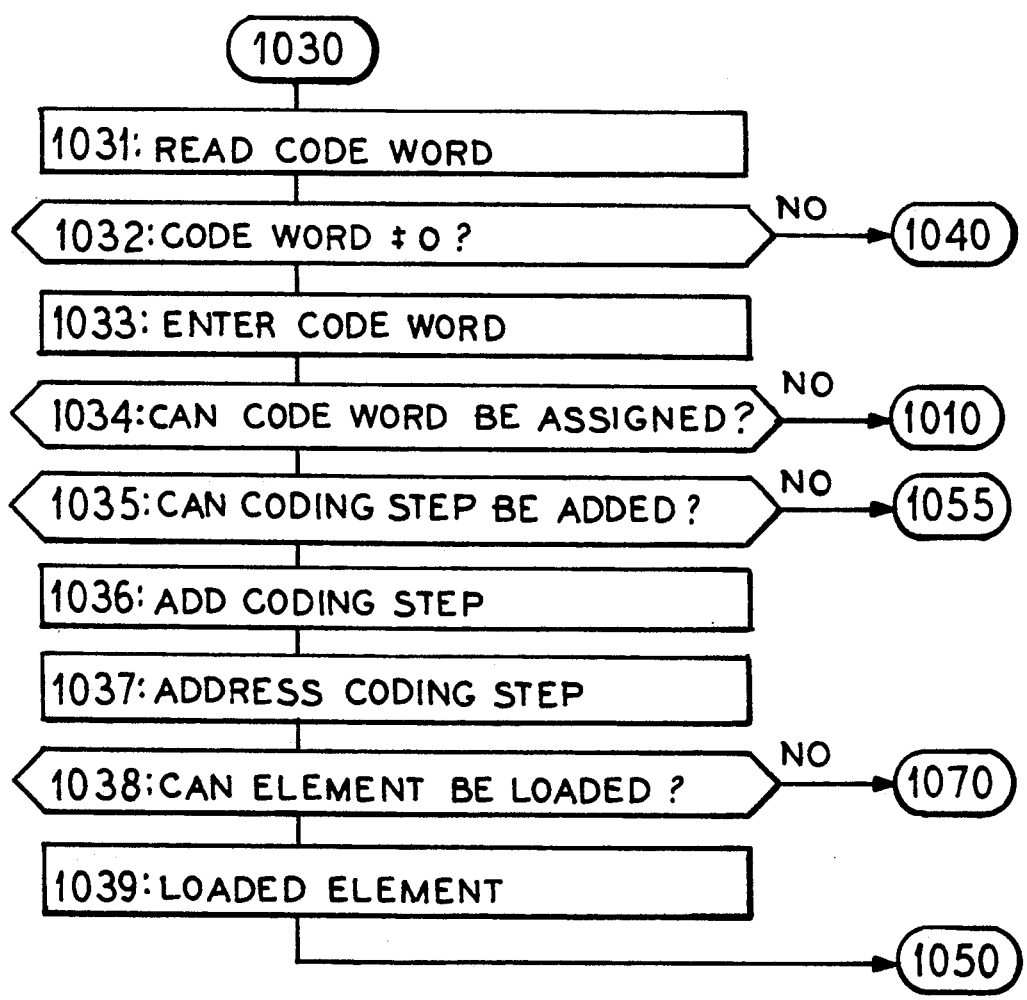

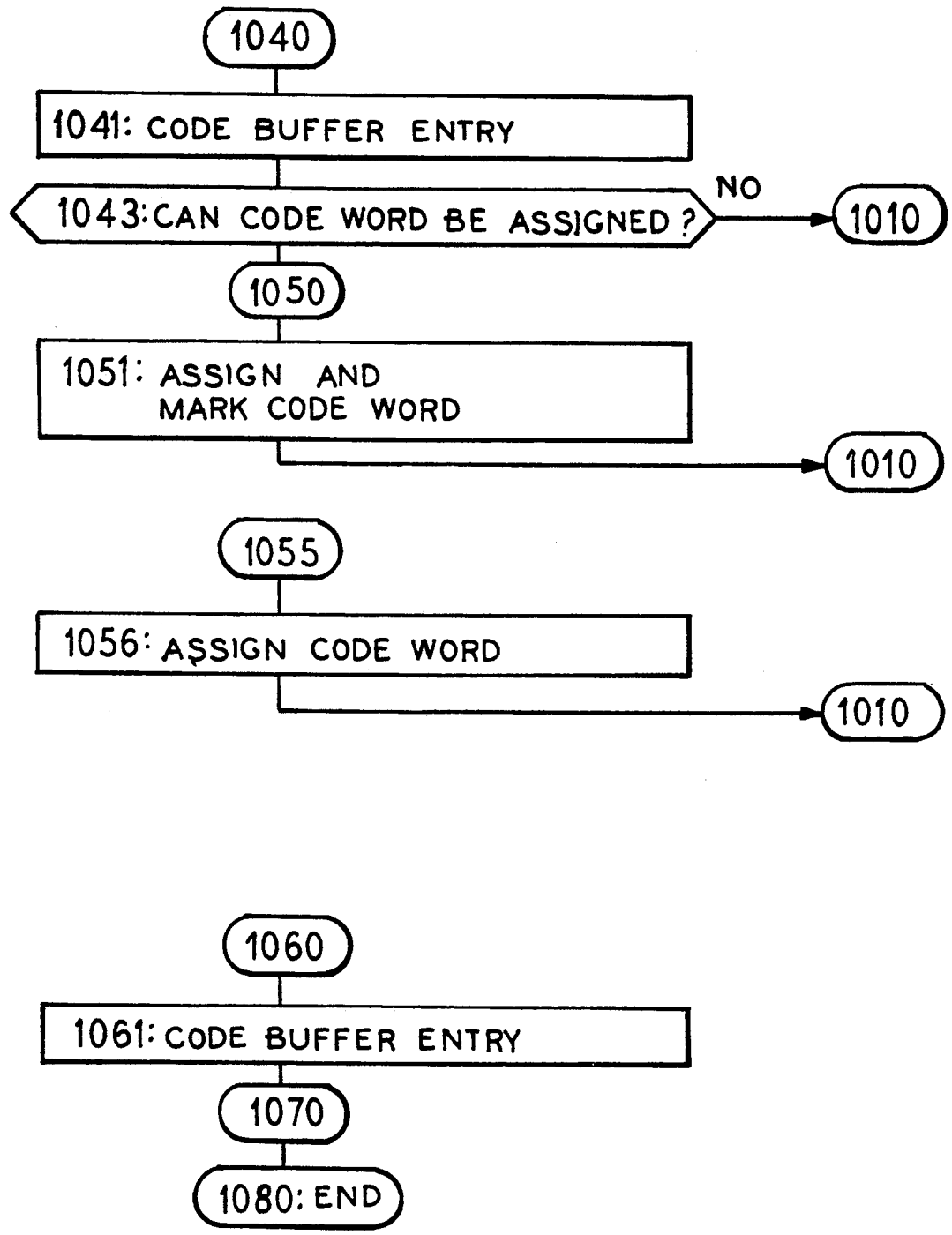
FIG. 7.3

PROCESS FOR USE WITH LEMPEL/GIN ENCODING

BACKGROUND OF THE INVENTION

The invention relates to a process for coding a sequence of elements, preferably for generating the Lempel/Ziv code for such a sequence of elements.

An A. Lempel and J. Ziv code is frequently used for reducing the redundancy of a sequence of, for example, coefficients of a discrete cosine transform for image values of picture elements of a reproduced image, preferably of a medical diagnostics image, for example of an X-ray image.

The authors Abraham Lempel and Jakob Ziv describe in the journal IEEE Transactions on Information Theory, Vol. IT-23, May 1977, in an article entitled "A Universal Algorithm for Sequential Data Compression" a coding of a sequence of elements. As agreed upon, the coding and decoding cooperate here. During the coding, the sequence of elements to be coded is processed sequentially element by element. In each case here, one of the elements or, respectively, a plurality of the elements are treated as a partial sequence. Accordingly, each of the partial sequences consists of at least one of the elements. Each of the partial sequences can be extended by an added element to form a further one of the partial sequences. As agreed upon, at the beginning of the coding, for each agreed element of a set of elements, which is also frequently referred to as the alphabet, in each case one partial sequence is known, consisting in each case of exactly one of the elements. These partial sequences known at the beginning are frequently also referred to as the primary partial sequences. A code consisting of code words which form a sequence of code words is generated as the result of the coding. In this case each code word corresponds to one partial sequence in each case. At the beginning of the coding, and likewise at the beginning of the decoding, in each case one agreed code word is assigned to each element of the set of elements, and hence also assigned to each primary partial sequence. These code words are frequently also referred to as the primary code words.

Beginning with the first element of the sequence of elements to be coded, the primary partial sequence for this element is recognized and the code word assigned to it is entered in the code as first code word of the code. After this the following element of the sequence of elements to be coded is processed. After a partial sequence has been recognized in each case, the following element is processed in two respects. Firstly the last partial sequence recognized is extended by this element to form an extended new recognized partial sequence, to which a following code word is assigned. This code word is here the next one in a sequence agreed for this purpose. And secondly, for searching for subsequent partial sequences, this element extending the partial sequence is used as the first element for the subsequent partial sequences to be searched for. In each case one partial sequence consisting of as many as possible directly successive elements, for which a code word has already been assigned, is searched for.

In his article "How to quadruple dial-up communications efficiency", Mini-Micro Systems, Vol. 21, No. 2, February 1988, Newton, Mass., USA, pp. 77-81, F. Bacon gives a general description of the Lempel/Ziv process for coding temporal sequences of elements of an alphabet. A coding process, the so-called Telcore model, is described in this paper by F. Bacon, which is to be understood as the connection of the Lempel/Ziv process with the Huffman coding. This process is not suitable for the generation of the Lempel/Ziv code, neither is it otherwise compatible with Lempel/Ziv codes. A contribution to the achieving of the object on which the present patent application is based cannot be found in the publication by F. Bacon. In particular, no reference is made to a process for code generation which avoids a searching for code words.

During the coding, in each case the entire list of the previously recognized partial sequences must be searched through here. The code word which is assigned to the longest of these partial sequences is entered in the code. After this, on the one hand this partial sequence is likewise extended with the element following this partial sequence, and on the other hand the search for following partial sequences commences.

During the decoding, the assigned partial sequences for the code words are decoded. In this case the respective partial sequence is likewise extended in each case by the immediately following element to form a recognized extended partial sequence. For this purpose, likewise a following code word is assigned in each case, which can likewise be assigned in accordance with the sequence agreed for this purpose.

With each extended partial sequence, therefore, the list of previously recognized partial sequences is also lengthened. The list to be searched through in each case is therefore constantly growing. As a consequence, the coding is constantly slowed down too.

SUMMARY OF THE INVENTION

The object of the invention is to disclose an extremely fast process for coding a sequence of elements with avoidance of a search, with which a Lempel/Ziv code is to be generated.

This object is achieved by a process for coding a sequence of elements by generating a Lempel/Ziv code for partial sequences. In the process a tree-like linked list is constructed from tables, referred to as coding steps; provided in each of these coding steps for each element is a location, referred to as coding site, at which a code word and a coding step pointer to a subsequent coding step may be assigned to this element; and a code word of a partial sequence to be coded is assigned to this partial sequence by a coding site, to which the coding step pointer belonging to a subsidiary partial sequence which is produced by deletion of the last element of the partial sequence to be coded points.

The object is furthermore to disclose a device for carrying out the process.

As agreed upon, primary partial sequences consisting of one element in each case are assumed. The elements here form the given set of elements. As agreed upon, the sequence of the elements is defined. An element position is also agreed for each of the elements, which is the same position in each case as a code word position of the assigned primary code word in the agreed code word sequence, for the assignment of code words. This position is used for locating the coding site assigned to the element within a coding step. At each coding site, on the one hand one code word and on the other hand one coding step pointer can be marked in each of the coding steps. In addition it is provided that it is possible to recognize whether a code word and/or a coding step pointer is not marked. In this case once a marking has been performed it is neither altered nor canceled.

Starting from a primary coding step, as far as is necessary further of the coding steps are successively linked by means of the coding step pointer in the form of a tree-like coding structure. This coding structure is used here to execute the search for recognized partial sequences efficiently and quickly. In each case the first element of the examined partial sequence is here checked in accordance with its coding site in the primary coding step which can be determined by means of the element position. In this case, a coding step pointer marked at this coding site points to the coding step linked in such a way, in which the immediately following element of the partial sequence examined is checked. In accordance with the coding site which is assigned to this element and can be determined by means of the element position, it is checked in the coding step whether a coding step pointer is marked. It can be recognized from a marked code word in each case whether the previously examined elements form an already recognized partial sequence. In this way it is possible to locate the assigned code word for the previously examined partial sequence advantageously with the aid of the coding structure for each processed element.

The construction of the code structure is effected here gradually and in each case depending on the sequence of elements to be coded and the recognizable partial sequences contained therein. For each of the primary partial sequences that can be specified in accordance with the agreement, in each case one code word is marked at the coding site, which can be determined by means of the element position of the element, in the primary coding step. After the execution of this initialization operation, the first element of the sequence of elements to be coded is processed. On the one hand the marked code word is obtained from the primary coding step at the coding site which is assigned to this element and by means of which the element position can be determined, and on the other hand it is recognized that no extending partial sequence has yet been found for this found primary partial sequence. This is accomplished, for example, in that the coding step pointer marked in the primary coding step at the coding site is equal to zero. The code word of the found partial sequence marked at the coding site is inserted into the code sequence. It is checked, for example, on the one hand whether further code words are available and on the other hand whether further coding steps can be added. If necessary, in addition to the code word marking the found partial sequence at the coding site, for linking by means of a coding step pointer, an added coding step is marked in the found coding step. In the added coding step, at the coding site of the immediately following element, the partial sequence extended with this element is marked by means of a further one of the code words. The coding of the sequence of elements continues again with this extending element, beginning with the primary coding step. The sequence of elements is examined element by element for existing partial sequences. The partial sequences thereby found consist in each case of a primary element of the respective primary partial sequence, which is extended on a case by case basis by respectively following elements to form further partial sequences in each case. There exists here for each element of a found partial sequence in each case a found partial sequence consisting of the preceding elements in each case. There exists for each element of a found partial sequence a coding step provided for checking this element. It is marked in this, at the coding site assigned to the element, on the one hand the code word of the previous partial sequence, and also on the other hand whether further found extended partial sequences are marked. In the case where a found extended partial sequence is marked, the coding step pointer marks a further coding step. In the case where no further coding step is marked, a further coding step is added, as described, for the following element. Otherwise, it is checked for the following element in the added coding step at the coding site whether a code word and hence a found partial sequence is marked. In the case where a code word equal to zero, for example, is marked in the added coding step at the coding site, the previous partial sequence is extended by this element by means of branching. In this case the previous partial sequence has already been extended at an already found partial sequence by one of the elements other than the one now following the previous partial sequence. Accordingly, there are two found extensions to two extended partial sequences branching to the previous partial sequence. The last found partial sequence extended by branching is likewise marked by an assigned code word. A further one of the code words is marked in each case at the coding site of the extending element assigned to the extended partial sequence. The code word of the previously found partial sequence is inserted here in each case into the code sequence to be generated. In this way the code sequence is constructed from code words of already found partial sequences. Each element extending a found partial sequence is subsequently checked in each case at the coding site in the primary coding step and each further following element is checked in each case in the coding step added for this purpose and located by means of the coding step pointer. An already found partial sequence is recognized here by a marked code word. In this way it is possible to locate directly the element position in the respective coding step for each of the elements to be checked, so that the found partial sequence can be recognized by a marked code word, and on the other hand an extension of the partial sequences can be recognized by the coding step pointer. On the one hand it is a particularly simple matter to check partial sequences found in this way, and on the other hand an extension of the existing partial sequences can be consequently realized in a particularly simple manner. The code generation process according to the invention thus makes it possible to achieve an extremely fast coding of the sequence of elements.

A preferred embodiment of the code generation process is characterized in that, in a conversion process, the sequence of elements is obtained from a primary sequence consisting of primary elements of a primary set that is larger with respect to the set of elements, in that at least one escape element is specified from the elements of the set of elements, and all of the other elements of the set of elements are assigned in each case to one of the primary elements of the primary set, and all of the other primary elements of the primary set are assigned in each case to an escape sequence which is formed in each case from at least one of the escape elements and at least one of the elements of the set of elements. The sequence of elements to be coded is here obtained by conversion from a primary sequence. The larger primary set of primary elements is here reduced to the set of elements of the sequence of elements. As a result of this conversion, the number of coding sites in the coding steps is reduced. Further advantages are conferred in particular whenever specific primary elements of the primary sequence occur particularly frequently, and in particular a large part of the primary elements of the primary sequence occur particularly infrequently, so that the escape sequences also occur particularly infrequently. For example, if this applies to in each case half of the primary elements of the primary set of the primary sequence, then the escape sequence can advantageously be formed from one escape element and one of the elements of the set of elements, which may also likewise be the escape element. If the number of infrequently occurring primary elements is equal to the square of the number of frequently occurring primary elements, then the escape sequence can be advantageously formed from the escape element and two further elements of the set of elements. Likewise, in accordance with the exponent in the case, for example, of a higher exponent for the number of infrequently occurring elements in comparison with the number of frequently occurring elements, the escape sequence can advantageously be formed from the escape element and a number of elements of the set of elements equal to the exponent. If, for example, the primary sequence consists of the coefficients of a discrete cosine transform of image values of picture elements of a reproduced image, then, for example, an escape sequence consisting of the escape element and two elements of the set of elements is advantageous for medical images. Depending on the degree of detail of the respective image, the coefficients for specific values of a set of values are particularly frequent. In the case of images with a particularly low degree of detail, longer escape sequences are advantageous. A favorable length of the escape sequence is frequently determined with the aid of experimental tests.

A preferred embodiment of the invention is characterized in that a marking of further ones of the partial sequences is marked by a use of a code word specified for this purpose. In particular in the case of longer sequences of elements and a smaller set of code words, from case to case such a large number of partial sequences is found so that the number of code words in the set of code words is no longer sufficient to mark further partial sequences. Likewise the case may also occur that, in particular with a smaller number of coding steps provided, a further one of the coding steps can no longer be added. In these cases, for example, the code word that can be assigned last in accordance with the agreement is used to mark this situation. As agreed upon, for facilitation and acceleration during the decoding of the code sequence, this code word can likewise terminate the marking of further partial sequences. In the case where such a code word is not agreed or is not used, further of the code words are not used during the coding, exactly because further of the found partial sequences are no longer marked. Although the partial sequences that still continue to be marked are kept available during the decoding, they are no longer used for the coding. The assignment of code words is frequently continued even once the adding of coding steps has been terminated, especially if a smaller number of coding steps provided is being used. In this case the code words that continue to be assigned are entered in the respective already linked coding steps as far as this is possible. Code words, which although they have been assigned and hence are unavailable, but could no longer be entered in a coding step due to the lack of available coding steps, are also not entered in the code word sequence and are also unusable subsequently for the data compression.

A further preferred embodiment of the invention relates to a code generation device for carrying out the process according to one of the aforesaid embodiments of the invention and is characterized by a storage means for storing the coding steps. The storage means here may be an electronic register memory. For example, the coding structure can already be prepared bit by bit, with in each case a separate bit for the marking of in each case one of the marked code words or in each case of a separate bit for the marking of in each case one of the coding step pointers. Such a bit can be, for example, the most significant or least significant bit of a register. The code words and coding step pointers to be marked are stored and interrogated in the storage means by means of a, for example, electronic processor arrangement. As a result, a processor arrangement of this type can be constructed with particularly small dimensions. Particularly in the case of a smaller set of elements, and also a smaller set of code words, the processor arrangement may be arranged on a single semiconductor chip. The known advantages of high integration technology are thus conferred. A high capacity of the processor arrangement is required in particular in an application for the transmission of medical images. Frequently between 10 and 25 images per second consisting of around 2000 times 2000 picture elements are recorded, and are compressed and transmitted by means of the process according to the invention. In some applications, these are also, for example, 50 images per second with 4000 times 4000 picture elements each.

In this case the execution of the process according to the invention can be applied particularly advantageously, for example, by means of a special circuit arrangement specifically adapted to the process according to the invention. The construction of such a particularly powerful circuit can be executed advantageously in particular with reference to the flowchart of FIG. 7, which is explained separately below with reference to an exemplary embodiment.

A further preferred embodiment of the invention is characterized by at least one directly addressable data memory of the storage means. As a result of the storage of the coding structure in a directly addressable data memory, it is possible in particular to realize cost-effective preferred embodiments of the invention. For example, the use of one or more storage disks for storing the coding structure by a use of a coding step pointer formed from the respective device address and respective disk address is advantageous in particular given a large set of elements and a large set of code words.

A further preferred embodiment of the invention is characterized in that the code word, the coding step pointer, as well as elements of the sequence of elements are provided in a binary representation. In particular with respect to the storage, this conversion into the binary representation makes it possible to realize as small a storage space requirement as possible.

A preferred embodiment of the invention is characterized in that exactly one escape element is used with a specific numerical value. An escape element of a most significant numerical value can be preferably applied in particular for sequences of elements whose elements exhibit an accumulation of least significant element values. Particularly favorable for, for example, sequences of elements not containing one specific element value at all is the use of this element value for the escape element. This applies in many applications, for example, to the element value equal to zero.

A further preferred embodiment of the invention is characterized in that one element of the sequence of elements has a number of data bits which is at least half as large as a number of primary data bits in a primary element of a primary sequence, which can consequently be divided into a least significant bit group of the primary element in accordance with the number of data bits and into the most significant bit group. As a result, it is possible to define in an advantageous manner an escape sequence consisting of the escape element and two elements of the set of elements.

A further preferred embodiment of the invention is characterized in that an escape sequence is provided which consists of the escape element, whose numerical value is greater than or equal to the numerical value of the escape element, followed by the two elements which [lacuna] in each case from the two bit groups of the primary element to a conversion of one of the primary elements. As a result, it is a particularly simple matter to convert a primary element into two elements of the escape sequence.

A further preferred embodiment of the invention is characterized in that the primary sequence is generated from coefficients of a discrete cosine transform of image values of picture elements of a reproduced image in a transformation process for obtaining an accumulation point of the primary sequence for a given numerical value. The coefficients of the discrete cosine transform exhibit an accumulation of the numerical value in the vicinity of the numerical value of zero for less detailed images in particular. This applies, for example, to particularly detailed medical diagnostics images, for example to X-rays. Owing to the accumulation, such images are particularly suitable for the code generation process. In a transformation process the positive numerical values, for example, are transformed into even primary elements and the negative numerical values are transformed into odd primary elements. This confers advantages particularly for the formation of the escape sequences using the least significant and most significant bit groups of the primary elements.

Further preferred favorable embodiments of the invention can be demonstrated by numerous tests, in particular with medical images. Particularly favorable is a code word bit number of the code word between 10 and 16, a data bit number of the element between four and eight, and also a primary bit number of the primary elements between 10 and 16. The optimum results can frequently be achieved with a number of code word bits equal to 14, a number of data bits equal to 6, and a number of primary bits equal to 12.

A further preferred embodiment of the invention is characterized in that in each case the code word and the coding step pointer are provided in such a way that they can be stored in an identical memory cell of the data memory identical to the element positions of one of the coding steps. As a result, the code word and the coding step pointer can be read out simultaneously by means of one memory access to the memory cell.

A further preferred embodiment of the invention is characterized in that, by means of one memory access to the memory cell, on the one hand the code word can be loaded into one register and on the other hand the coding step pointer can be loaded into a further one of the registers. As a result, the code word and the coding step pointer can be loaded simultaneously into different registers with one memory access. This makes it possible to achieve a particularly fast execution of the code generation.

A further preferred embodiment of the invention is characterized in that a coding step number of the coding steps which is less than/equal to the code word number of the code words is provided. A number of coding steps equal to the number of code words confers the advantage that it is possible to use all code words in every case, even in the case of a sequence of elements which exclusively consists of partial sequences extended by lengthening. The more branchings found for the partial sequences, the lower the number of coding steps may be.

A further preferred embodiment of the invention is characterized in that the coding step number of the coding steps is between one half and one seventh, and preferably equal to one third, of the number of code words. The storage space requirement can consequently be reduced. In particular with a large number of tests, it has been demonstrated for medical images, for example, that these values are favorable for the number of coding steps.

A further preferred embodiment of the invention is characterized in that a maximum number of elements between 100 and 500 is provided for the partial sequences. It is consequently possible to avoid, for in the case of empty image blocks, a comparatively long delay of the code. In this respect, values of the maximum number between 100 and 500 have proved to be favorable in numerous tests. The optimum value for the maximum number is around 250.

A further preferred embodiment of the invention is characterized in that the code generation process is carried out by means of a general-purpose computer. As a result it is possible, for example with the use of higher programming languages, to control and check the correct execution in a known manner. Such a program can be produced more easily in a known manner.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

FIG. 1 shows a primary coding step before the processing of the first element of the sequence of elements.

FIG. 2 shows two coding steps after the processing of the first element of the sequence of elements.

FIG. 3 shows three coding steps during the processing of the coding.

FIG. 4 shows four coding steps during the processing of the coding.

FIG. 5 shows four coding steps during the processing of the coding.

FIGS. 7.0–7.3 show a flowchart for the execution of the coding.

DESCRIPTION OF THE PREFERRED EMBODIMENT

Figure 8:
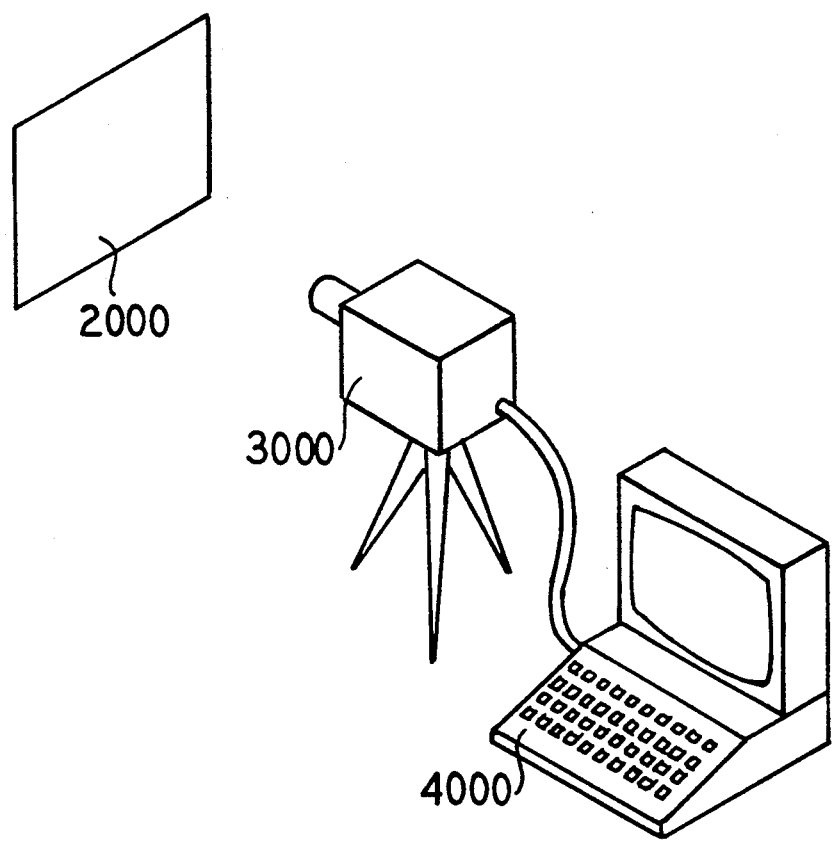
FIG. 8 shows an arrangement for the exemplary embodiment.

As FIG. 8 shows, an X-ray image 2000 is recorded as a medical diagnostics image by a camera 3000. The image values obtained from this are stored in a computer system 4000 compressed using a discrete cosine transform. The coefficients obtained in this way are further compressed with the process according to the invention, stored and archived on data carriers. The coefficients of the discrete cosine transform form here a primary sequence for the process according to the invention. The primary sequence is converted into a sequence of elements with the aid of escape sequences. After this, the sequence of elements is coded with the aid of a coding structure to form a code word sequence, which in this exemplary embodiment is achieved.

As Table 1 below shows, the exemplary embodiment assumes a primary sequence 600 consisting of primary elements 600.0, 600.1, . . . 600.5.

TABLE 1

| |
|---|
| 600.0: 000000000000 |
| 600.1: 000000000000 |
| 600.2: 000000000000 |
| 600.3: 000000111111 |
| 600.4: 000000000000 |
| 600.5: 000000000000 |

Each of the primary elements 600.0, 600.1, . . . 600.5 here consists of a primary bit number of 12 bits in a binary representation. In a conversion process, with this exemplary embodiment the primary sequence 600 is converted into a sequence of elements 700 consisting of the elements 700.0, 700.1, . . . 700.7, which have in each case a data bit number of 6 bits in the binary representation. As agreed upon, the element with the most significant numerical value is used as escape element. The primary elements of the primary sequence 600, whose numerical value is less than the numerical value of the escape element, are converted in each case during the conversion process into elements with the same numerical value. This is performed for all primary elements of the primary sequence 600 with the single exception of the primary element 600.3, for which an escape sequence is required. The primary element 600.3 of the primary sequence 600 is here divided into its most significant bit group and into its least significant bit group. In the exemplary embodiment, the primary element 600.3 is converted to form an escape sequence consisting of the elements 700.3, 700.4 and 700.5. In this case the element 700.3 is the escape element, which is at the beginning of the escape sequence. Following the escape element 700.3 is the element 700.4, whose numerical value is equal to the numerical value of the least significant bit group of the primary element 600.3. This is then followed by the element 700.5, whose numerical value is equal to the numerical value of the most significant bit group of the primary element 600.3 of this exemplary embodiment. After the conversion of the escape sequence, the primary element 600.4 is converted into the element 700.6, and the primary element 600.5 is converted into the element 700.7. After the conversion, the sequence of elements 700 shown in the table below is obtained.

TABLE 2

| |
|---|
| 700.0: 000000 |
| 700.1: 000000 |

TABLE 2-continued

| |
|---|
| 700.2: 000000 |
| 700.3: 111111 |
| 700.4: 111111 |
| 700.5: 000000 |
| 700.6: 000000 |
| 700.7: 000000 |

The sequence of elements 700 is coded with the aid of a coding structure consisting of coding steps, in which in each case one coding site is provided for each of the possible numerical values of the elements. The coding site assigned to an element is located here with the aid of the numerical value.

As FIG. 1 shows, a primary coding step 200.0 is to consist of coding site 100.0, 100.1, . . . 100.63. In each of the coding steps here, on the one hand in each case it is possible to mark one of the code words at each of the coding sites, and on the other hand it is possible to mark in each case one of the coding step pointers. This is represented in the figures in such a way that each of the coding sites consists in each case of two half fields. The top one of the two half fields of one of the coding sites is provided here for a representation of a marked code word. The bottom one of the two half fields of one of the coding sites is provided for the representation of a marked coding step pointer.

In each of the coding sites 100, in each case after the initialization and immediately before the coding of a sequence of elements commences, on the one hand in each case the code word 300.0, 300.1, . . . 300.63 is marked and on the other hand a coding step pointer is not marked in any of the coding sites 100.0, 100.1, . . . 100.63 of the primary coding step 200.0. In each of the coding sites 100 of coding steps 200, a code word value equal to 0 means here that a code word is not marked. Likewise, a coding step pointer value equal to 0 means that a coding step pointer is not marked. The single exception here in this exemplary embodiment is the coding site 100.0 in the primary coding step 200.0, at which a code word value equal to 0 is marked. This marking is permitted because this code word is already marked in any case during the initialization operation before the commencement of the coding operation and is no longer altered during the course of the further coding operation, and because this code word value cannot be marked in particular at any other coding site of the primary coding step and likewise in any other of the coding steps 200.

As Table 3 below shows, in each case code words 300.0, 300.1, . 300.63, each consisting of a code bit number of 14 bits, are marked in the primary coding step 200.0 at the coding sites 100.0, 100.1, . . . 100.63.

TABLE 3

| |
|---|
| 300.0: 00000000000000 |
| 300.1: 00000000000001 |
| 300.2: 00000000000010 |
| 300.3: 00000000000011 |
| . . . |
| 300.63: 00000000111111 |

The coding operation is started in sequence and the first element 700.0 of the sequence of elements 700 represented in Table 2 is processed. As FIG. 2 shows, it is checked here by means of the numerical value of the element 700.0 at the coding site 100.0 in the primary coding step 200.0 whether a coding step pointer is marked. This is not the case to begin with. The marked code word 300.0 is therefore entered in the code word sequence. One of the coding steps, in this case the coding step 200.1, is then added and marked by the coding step pointer 400.1 at the coding site 100.0 of the primary coding step 200.0.

In this exemplary embodiment, the numerical value of the coding step pointer 400 is in each case equal to the index of the coding step 200. The marked numerical value of the coding step pointer 400.1, which marks the coding step 200.1, is accordingly equal to 1. A marked numerical value equal to 0 means here that no marking step is marked. This is permitted in particular because the coding step 200.0 is the primary coding step, for which no marking is provided in any of the coding steps so that it is possible to use a numerical value equal to 0 for this.

The following element 700.1 is processed. A further code word 300.64 is marked in the coding step 200.1 at the coding site 100.0 assigned to this element in accordance with the numerical value of this element. As a result of this code word 300.64, the partial sequence consisting of the element 700.0 followed by the element 700.1 is then marked.

Marked partial sequences continue to be searched for with the element 700.1. As FIG. 3 shows, at the coding site 100.0 assigned to the element 700.1 in accordance with the numerical value of this element in the primary coding step 200.0, the coding step pointer 400.1 is recognized, by means of which the coding step 200.1 is marked. In this coding step 200.1, it is checked at the coding site 100.0 assigned to the following element 700.2 in accordance with the numerical value of this element whether a coding step pointer is marked. This is not the case to begin with. It is therefore checked whether one of the code words is marked at this coding site. This is the case. The marked code word 300.64 is therefore entered in the code word sequence. After this a further one of the coding steps, in this case the coding step 200.2, is added and marked by the coding step pointer 400.2 at the coding site. The following element 700.3 is processed. At the coding site 100.63 assigned to this element in accordance with the numerical value of this element, a further one of the code words 300.65 is marked in the added coding step 200.2. As a result of this code word, the partial sequence consisting of the elements 700.1, 700.2 and 700.3 is marked.

Partial sequences continue to be searched for with the element 700.3. As FIG. 4 shows, at the coding site 100.63 assigned to the element 700.3 in accordance with the numerical value of this element, it is checked in the primary coding step 200.0 whether a coding step pointer is marked. This is not the case to begin with. The code word 300.63 marked at this KS 100.63 in the primary coding step 200.0 is therefore entered in the code word sequence. After this, in this exemplary embodiment, the coding step 200.3 is added and marked by the coding step pointer 400.3 at the KS 100.63 in the primary coding step 200.0. The next element 700.4 is processed. At the coding site 100.63 assigned to this element 700.4 in accordance with the numerical value of this element, a further code word 300.66 is marked in the added coding step 200.3. As a result of this code word, a partial sequence consisting of the elements 700.3 and 700.4 is marked.

Partial sequences continue to be searched for with the element 700.4. As FIG. 5 shows, in the primary coding step 200.0 at the coding site 100.63 assigned to the element 700.4 in accordance with the numerical value of this element, the coding step 200.3 is marked by the coding step pointer 400.3. The following element 700.5 is processed. At the coding site 100.0 assigned to the element 700.5 in accordance with the numerical value of this element it is checked in the coding step 200.3 whether a coding step pointer is marked. This is not the case. It is therefore checked whether one of the code words is marked at this coding site 100.0 in the coding step 200.3. This is not the case to begin with. The code word 300.63 is therefore entered in the code word sequence. A further one of the code words 300.67 is marked at the coding site 100.0 of the coding step 200.3. As a result of this code word, a partial sequence consisting of the elements 700.4 and 700.5 is marked.

Figure 6:
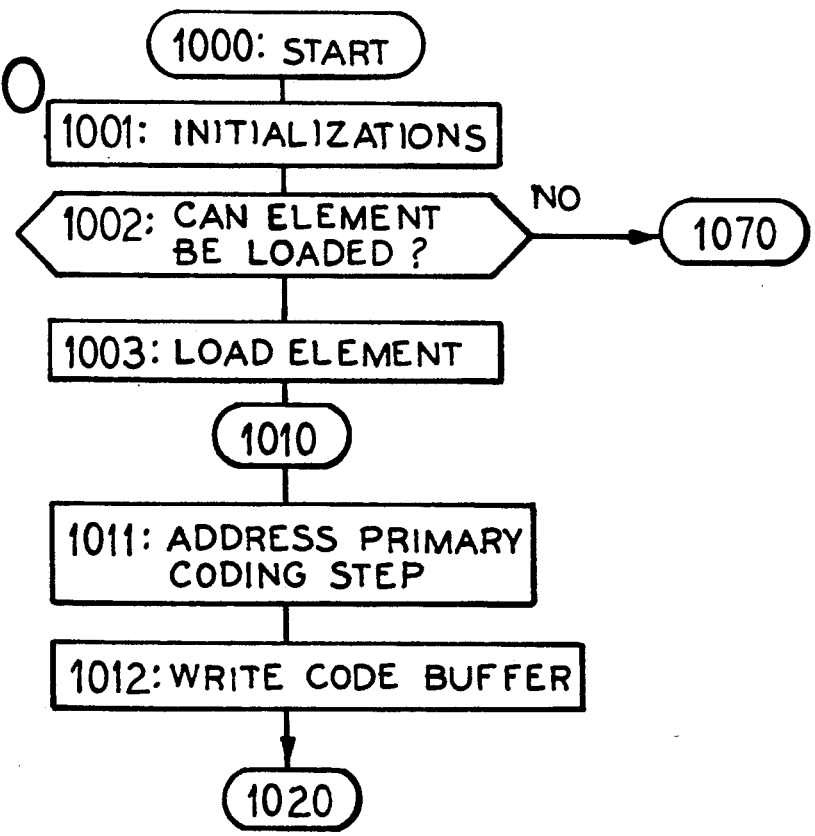
FIG. 6 shows four coding steps during the processing of the coding.

Partial sequences continue to be searched for with the element 700.5. As FIG. 6 shows, at the coding site 100.0 assigned to the element 700.5 in accordance with the numerical value of this element, in the primary coding step 200.0 the coding step pointer 400.1 is found, by means of which the coding step 200.1 is marked. The following element 700.6 is processed. In the coding step 200.1, at the coding site 100 0 assigned to the element 700.6 in accordance with the numerical value of this element, the coding step pointer 400.2 is found, by means of which the coding step 200.2 is marked. The following element 700.7 is processed. In the coding step 200.2, it is checked at the coding site 100.0 assigned to the element 700.7 in accordance with the numerical value of this element whether a coding step pointer is marked. This is not the case. It is therefore checked whether one of the code words is marked in the coding step 200.2 at the KS 100.0. This is the not the case to begin with. The code word 300.64 is therefore entered in the code word sequence. A further one of the code words 300.68 is then marked in the coding step 200.2 at the coding site 100.0. As a result of this code word, a partial sequence consisting of the elements 700.5, 700.6 and 700.7 is marked.

Partial sequences continue to be searched for with the element 700.7. In the primary coding step 200.0, the coding step pointer 400.1 is found at the coding site 100.0 assigned to the element 700.7 in accordance with the numerical value of this element. An attempt is then made to process the following element. Since in this exemplary embodiment no further element is present, the marked code word 300.0 is entered in the code word sequence.

Accordingly, the code sequence 800 was generated in this exemplary embodiment, as Table 4 below shows.

TABLE 4

| | |
|---|---|
| 800.0 (= 300.0) | 00000000000000 |
| 800.1 (= 300.64) | 00000001000000 |
| 800.2 (= 300.63) | 00000000111111 |
| 800.3 (= 300.63) | 00000000111111 |
| 800.4 (= 300.64) | 00000001000000 |
| 800.5 (= 300.0) | 00000000000000 |

The code word sequence 800 is here the result of the coding operation of this exemplary embodiment.

The flowchart represented in FIG. 7 is helpful for executing the coding operation, particularly when producing an electronic device. This flowchart is likewise useful when producing a program sequence formulated in one of the programming languages.

The beginning of the coding operation of this exemplary embodiment is represented by the instruction 1000 in the flowchart represented in FIG. 7.0.

This is followed by the instruction 1001 with an execution of initializations, in particular with the marking of the primary partial sequences in the primary coding step.

This is then followed by the instruction 1002 with the interrogation as to whether an element of the sequence of elements can be loaded. If this is not possible, because of the end of the file for example, the program branches to the instruction 1070, which is represented in FIG. 7.3.

The instruction 1003 then follows with the loading of the first element of the sequence of elements and the preparation of the coding site, which can be determined by means of the numerical value of the element and is assigned to the loaded element, within the coding steps.

This is followed by the instruction 1010, to which the program branches from case to case from the interrogations 1042 represented in FIG. 7.3, and to which the program likewise branches from case to case from the interrogations 1034 and 1035 represented in FIG. 7.2, and to which the program branches unconditionally after execution of the instruction 1051 represented in FIG. 7.3.

The instruction 1011 then follows with the addressing of the primary coding step.

The instruction 1012 then follows with the entry in the code buffer. A code word is entered here which is taken from the primary coding step from the coding site which can be determined by means of the numerical value of the last element loaded in each case.

This is followed by the instruction 1020, which is represented in FIG. 7.1, and to which the program branches unconditionally after execution of the instruction 1026, which is represented in FIG. 7.1.

The instruction 1021 then follows with the reading of the coding step pointer from the last addressed coding step from the coding site which can be determined by means of the numerical value of the respective last element loaded.

The instruction 1022 then follows with the interrogation as to whether the last coding step pointer read is not equal to zero. If this is not the case, the program branches to the instruction 1030, which is represented in FIG. 7.3.

The instruction 1023 then follows with the entry in the code buffer. A code word is entered here which is taken from the last addressed coding step from the coding site which can be determined by means of the numerical value of the last element loaded in each case.

The instruction 1024 then follows with the interrogation as to whether an element of the sequence of elements can be loaded. If this is not possible, because of the end of the file for example, the program branches to the instruction 1060, which is represented in FIG. 7.4.

The instruction 1025 then follows with the loading of the following element of the sequence of elements and the preparation of the coding site, which can be determined by means of the numerical value of the element and is assigned to the loaded element, within the coding steps.

The instruction 1026 then follows with the addressing of the coding step which can be determined by means of the last coding step pointer read.

The branching to the instruction 1020, which is represented in FIG. 7.1, then follows unconditionally.

The instruction 1030 then follows, which is represented in FIG. 7.2, and to which the program branches from case to case from the instruction 1022, which is represented in FIG. 7.1.

The instruction 1031 then follows with the reading of the code word from the last addressed coding step from the coding site which can be determined by means of the numerical value of the last element loaded in each case.

The instruction 1032 then follows with the interrogation as to whether the last code word read is not equal to zero. If this is not the case, the program branches to the instruction 1040, which is represented in FIG. 7.3.

The instruction 1033 then follows with the entry of the last code word read in the code word sequence to be output.

The instruction 1034 then follows with the interrogation as to whether a further one of the code words is available and can be assigned. If this is not the case, because all code words have already been assigned to partial sequences of the sequence of elements for example, that is to say no further code words are available and can be assigned, the program branches to the instruction 1010, which is represented in FIG. 7.0.

The instruction 1035 then follows with the interrogation as to whether a further one of the coding steps is available and can be added. If this is not the case, because all coding steps have already been added and linked to coding steps for example, that is to say no further coding steps are available and can be added, the program branches to the instruction 1010, which is represented in FIG. 7.0.

The instruction 1036 then follows with the adding and linking of one of the coding steps that is available and can be added. In this case the coding step pointer, by means of which this coding step is linked and can be determined, is entered and marked in the last addressed coding step at the coding site which can be determined by means of the numerical value of the last element loaded in each case.

The instruction 1037 then follows with the addressing of the added coding step.

The instruction 1038 then follows with the interrogation as to whether an element of the sequence of elements can be loaded. If this is not possible, because of the end of the file for example, the program branches to the instruction 1060, which is represented in FIG. 7.3.

The instruction 1039 then follows with the loading of the following element of the sequence of elements and the preparation of the coding site, which can be determined by means of the numerical value of the element and is assigned to the loaded element, within the coding steps.

The branching to the instruction 1050, which is represented in FIG. 7.3, then follows unconditionally.

The instruction 1040 then follows, which is represented in FIG. 7.3, and to which the program branches from case to case from the instruction 1032, which is represented in FIG. 7.2.

The instruction 1041 then follows with the reading of the code word last entered in the code buffer, and the entry of this code word in the code word sequence to be output.

The instruction 1042 then follows with the interrogation as to whether a further one of the code words is available and can be assigned. If this is not the case, because all the code words have already been assigned to partial sequences of the sequence of elements for example, that is to say no further code words are available and can be assigned, the program branches to the instruction 1010, which is represented in FIG. 7.0.

The instruction 1050 then follows, to which the program branches unconditionally after execution of the instruction 1039, which is represented in FIG. 7.2.

The instruction 1051 then follows with the assignment and marking of a further one of the code words. In this case the assigned code word is entered and marked in the last addressed coding step at the coding site which can be determined by means of the numerical value of the last element loaded.

The branching to the instruction 1010, which is represented in FIG. 7.0, then follows unconditionally.

The instruction 1055 then follows, to which the program branches from case to case from the instruction 1035, which is represented in FIG. 7.2.

The instruction 1056 then follows with the assignment of a further one of the code words. In this case this assigned code word is not entered and neither is it used any longer in the sequence. The partial sequence assigned to this code word is subsequently entered in the code word sequence in each case during the coding with the code word of the shorter and non-extended partial sequence.

The branching to the instruction 1010, which is represented in FIG. 7.0, then follows unconditionally.

The instruction 1060 represented in FIG. 7.3 then follows, to which the program branches from case to case from the instruction 1024, which is represented in FIG. 7.1.

The instruction 1061 then follows with the reading of the code word last entered in the code buffer, and the entry of this code word in the code word sequence to be output.

The instruction 1070 then follows, to which the program branches from case to case from the instruction 1002, which is represented in FIG. 7.0, and to which the program branches from case to case from the instruction 1038, which is represented in FIG. 7.2.

The instruction 1080 then follows with the end of the coding operation.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A process for coding a sequence of elements by generating a Lempel/Ziv code for partial sequences, comprising the steps of:
    constructing a linked list having a linked tree structure from tables, said tables being coding stages;
    providing in each of the coding stages for each element of the sequence of elements a location, referred to as a coding site, at which a code word and a coding stage pointer to a subsequent coding stage may be assigned to a respective element;
    assigning a respective code word to a partial sequence to be coded at a respective coding site, to which a respective coding stage pointer points, the respective coding stage pointer belonging to a further partial sequence which is produced by deletion of a last element of the partial sequence to be coded.

2. The process according to claim 1, wherein each of the code words has between 10 and 16 bits.

3. The process according to claim 1, wherein an element of the sequence of elements is represented with 4 to 8 bits.

4. The process according to claim 1, wherein a number of coding stages is between one half and one seventh of a number of code words.

5. The process according to claim 1, wherein a maximum number of elements of partial sequences is between 100 and 500.

6. The process according to claim 1, wherein the elements of the sequence of elements are coefficients of a discrete cosine transform of image values of a digital image.

7. The process according to claim 1, wherein the steps of the process are carried out by means of a general-purpose computer.

8. The process according to claim 1, wherein each of the code words has 14 bits.

9. The process according to claim 1, wherein an element of the sequence of elements is represented with 6 bits.

10. The process according to claim 1, wherein a number of coding stages is one third of a number of code words.

11. The process according to claim 1, wherein a maximum number of elements of partial sequences is 250.

* * * * *